(12) United States Patent
Williams et al.

(10) Patent No.: US 6,287,877 B1
(45) Date of Patent: Sep. 11, 2001

(54) ELECTRICALLY QUANTIFYING TRANSISTOR SPACER WIDTH

(75) Inventors: Roger Williams; Mark Brandon Fuselier, both of Austin; Michael Verne Fenske, Round Rock, all of TX (US)

(73) Assignee: Advanced Micro Devices, Austin, TX (US)

( * ) Notice: Subject to any disclaimer, the term of this patent is extended or adjusted under 35 U.S.C. 154(b) by 0 days.

(21) Appl. No.: 09/668,524

(22) Filed: Sep. 22, 2000

(51) Int. Cl.[7] .................................................. G01R 31/26
(52) U.S. Cl. .............................. 438/14; 438/303; 438/305
(58) Field of Search .............................. 438/10, 11, 303, 438/305, 17, 14

(56) References Cited

U.S. PATENT DOCUMENTS

| | | | |
|---|---|---|---|
| 4,978,627 | * 12/1990 | Liu et al. | 438/14 |
| 5,010,029 | * 4/1991 | Liu et al. | 438/14 |
| 6,133,132 | * 10/2000 | Toprac et al. | 438/595 |

* cited by examiner

*Primary Examiner*—John F. Niebling
*Assistant Examiner*—Stacy A Whitmore
(74) *Attorney, Agent, or Firm*—Robert A. Voigt, Jr.; Winstead Sechrest & Minick P.C.

(57) ABSTRACT

A method for electrically quantifying a semiconductor device's spacers' width. In one embodiment, a method comprises the step of measuring a resistance across a region of interest of each of a plurality of semiconductor structures including the semiconductor device in question, where the region of interest may be a source or drain region of the semiconductor structure or may be one of a plurality of lightly doped drain regions of the semiconductor structure. The method further comprises determining a width of one of a plurality of lightly doped drain regions of the semiconductor device from the resistance across the region of interest of each of the plurality of semiconductor structures. The method further comprises determining the semiconductor device's spacers' width from the width of one of the plurality of lightly doped drain regions of the semiconductor device.

19 Claims, 6 Drawing Sheets

ELECTRICALLY QUANTIFYING TRANSISTOR SPACER WIDTH

TECHNICAL FIELD

The present invention relates to the field of semiconductor processing, and more particularly to a method for electrically quantifying a semiconductor device's spacer width.

BACKGROUND INFORMATION

Fabrication of semiconductor devices, e.g., transistors, is well known in the art. A background of the fabrication of a semiconductor device, e.g., transistor, is deemed appropriate. FIG. 1 illustrates a cross-section of a semiconductor topography where an oxide layer 4 is formed across a single crystalline substrate 2, e.g., silicon and gallium arsenide. Typically, oxide 4 is comprised of silicon dioxide. A polysilicon layer 6 is then deposited by a variety of techniques, e.g., low pressure chemical vapor deposition (LPCVD), across oxide 4.

FIG. 2 illustrates the formation of a gate conductor 10, a gate oxide 8, and exposed regions 14 and 16 of substrate 2. Portions of polysilicon layer 6 and oxide layer 4 of FIG. 1 may be etched to the underlying silicon substrate 2 thereby resulting in a configuration of FIG. 2. Exposed regions 14 and 16, i.e.,junction regions, are adjacent to gate conductor 10 spaced apart by gate oxide 8. Gate conductor 10 has vertically opposed sidewall surfaces 12 as a result of the etching. Furthermore, gate conductor 10 is separated from substrate 2 by a thin layer of gate oxide 8.

FIG. 3 illustrates the implantation of impurities in regions commonly referred to as lightly doped drain (LDD) regions 18 prior to the formation of a spacer (See FIG. 5) within the upper portion of substrate 2.

FIG. 4 illustrates an etch material 20 that may be grown or deposited across exposed regions 14 and 16 and gate conductor 10. Typically, etch material 20 etches at a slower rate than an overlying, subsequent formed spacer material (See FIG. 5). The thickness of etch material 20 is predetermined so that etch material 20 is not penetrated during the removal of the overlying spacer material.

FIG. 5 illustrates the deposition and partial removal of a spacer material 22 across etch material 20. Typically spacer material 22 is comprised of chemical vapor deposited nitride. After the deposition of spacer material 22, spacer material 22 may be removed using an antisotropic etch process at a faster rate along the horizontal surfaces than the vertical surfaces. Hence, spacer material 22 is primarily retained adjacent to sidewall surfaces 12 of gate conductor 10. The retained portions form what is commonly referred to as spacers 24 and 26. The etch duration is selected to last until the width of the spacers sufficiently masks portions of exposed regions 14 and 16 near the channel.

FIG. 6 illustrates a heavily doped source/drain implant that is forwarded to exposed areas of exposed regions 14 and 16 and to gate conductor 10. The dopants may be n-type, e.g., arsenic and phosphorus, or p-type, e.g., boron and boron difluoride, depending on the desired type of transistor. For example, if n-type dopants are implanted, then the transistor is an n-channel transistor device. If p-type dopants are implanted, then the transistor is a p-channel transistor device. The source/drain implant may be self-aligned to the exposed lateral surfaces of spacers 24 and 26. Thus, a drain region 28 and a source region 30 may be formed within the upper portion of substrate 2 on opposite sides of gate conductor 10. Drain region 28 and source region 30 are spaced from one of the sidewall surfaces 12 of gate conductor 10 by the width of one spacer, 24 and 26, respectively, and the width of the etch material 20 adjacent to the sidewall surfaces 12 of gate conductor 10.

Spacers 24 and 26 effectively control the width of LDD regions 18 by controlling how far drain and source regions 28 and 30 are spaced from the sidewall surfaces 12 of gate conductor 10. The width of LDD regions 18 effectively determines the length of gate conductor 10 which essentially determines the speed of the transistor. Therefore, it is imperative to develop a technique to quantify the width of spacers 24 and 26 and thereby adjust the manufacturing process to control the width of LDD regions 18.

One such technique involves the use of optical instrumentation to measure the thickness of the deposition of the spacer material across the etch material. Unfortunately, the technique indirectly measures the spacer width which results in inaccuracies. Furthermore, optical measurement devices are not accurate to characterize an electrical device because of what is commonly referred to as drift. Drift refers to the random internal changes in the measurement apparatus that affect the accuracy of the measurement.

It would therefore be desirable to quantify the spacer width more accurately and thereby adjust the manufacturing process to effectively control the width of the LDD regions and hence control the speed of the transistor.

SUMMARY

The problems outlined above may at least in part be solved in some embodiments by determining the width of a semiconductor device's spacers from the width of one of the plurality of lightly doped drain regions in the semiconductor device which is derived from the measured resistance across a region of interest of each of a plurality of semiconductor structures including the semiconductor device in question. The region of interest may be a source or drain region of the semiconductor structure or may be one of a plurality of lightly doped drain regions of the semiconductor structure. The resistance across the regions of interest may be used to determine various properties of the semiconductor structures such as the resistivity of lightly doped drain regions or the resistivity of the source/drain regions. Once the width of the semiconductor device's spacers is determined, the manufacturing process may then be adjusted to etch the proper amount of spacer material to form the correct spacer width.

In one embodiment, a method for electrically quantifying a semiconductor device's spacers' width comprises the step of measuring a resistance across a region of interest of each of a plurality of semiconductor structures including the semiconductor device in question, where the region of interest may be a source or drain region of the semiconductor structure or may be one of a plurality of lightly doped drain regions of the semiconductor structure. The method further comprises determining a width of one of a plurality of lightly doped drain regions of the semiconductor device from the resistance across the region of interest of each of the plurality of semiconductor structures. The method further comprises determining the semiconductor device's spacers' width from the width of one of the plurality of lightly doped drain regions of the semiconductor device.

In another embodiment of the present invention, a method for electrically quantifying a semiconductor device's spacers' width comprises the step of measuring a first resistance across a source or drain of a first semiconductor structure. The method further comprises measuring a second resistance across one of a plurality of lightly doped drain regions of a second semiconductor structure. The method further comprises measuring a third resistance across a source or drain region of a third semiconductor structure. The method further comprises measuring a fourth resistance across a source or drain region of a fourth semiconductor structure, where the fourth semiconductor structure comprises a plurality of lightly doped drain regions. Furthermore, the fourth semiconductor structure is the semiconductor device. The method further comprises determining a width of one of the plurality of lightly doped drain regions of the fourth semiconductor structure from the first, second, third and fourth resistance. The method further comprises determining the semiconductor device's spacers' width from the width of one of the plurality of lightly doped drain regions of the fourth semiconductor structure.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

A better understanding of the present invention can be obtained when the following detailed description is considered in conjunction with the following drawings, in which.

DETAILED DESCRIPTION

The present invention comprises a method for electrically quantifying a semiconductor device's spacers' width. In one embodiment of the present invention the width of a semiconductor device's spacers is determined from the width of one of the plurality of lightly drain regions in the semiconductor device which is derived from the measured resistance across a region of interest of each of a plurality of semiconductor structures including the semiconductor device in question. The region of interest may be a source or drain region of the semiconductor structure or may be one of a plurality of lightly doped drain regions of the semiconductor structure. The resistance across the regions of interest may be used to determine various properties of the semiconductor structures such as the resistivity of lightly doped drain regions or the resistivity of the source/drain regions. Once the width of the semiconductor device's spacers is determined, the manufacturing process may then be adjusted to etch the proper amount of spacer material to form the correct spacer width.

Figure 1:
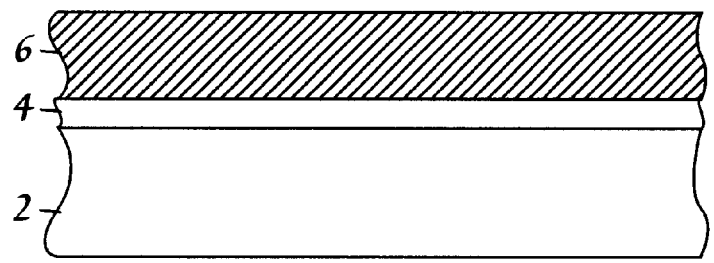
FIG. 1 is a cross-sectional view of a semiconductor topography illustrating an oxide layer formed across a singly crystalline substrate.
Figure 2:
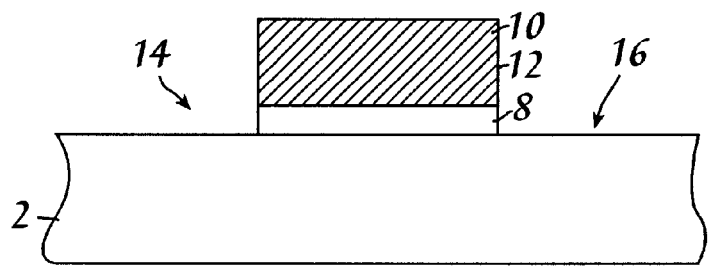
FIG. 2 is a cross-sectional view of a semiconductor topography illustrating the formation of a gate conductor, a gate oxide and exposed regions of the substrate.
Figure 3:
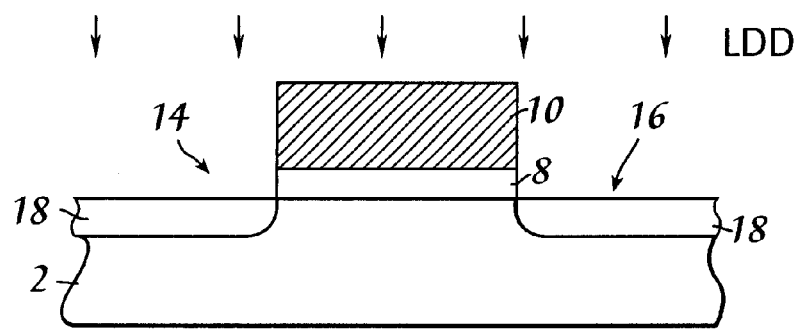
FIG. 3 is a cross-sectional view of a semiconductor topography illustrating the implantation of impurities.
Figure 4:
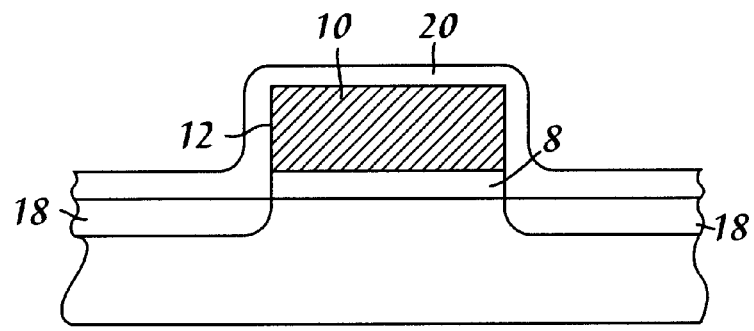
FIG. 4 is a cross-sectional view of a semiconductor topography illustrating an etch material that may be grown or deposited across the exposed regions and the gate conductor.
Figure 5:
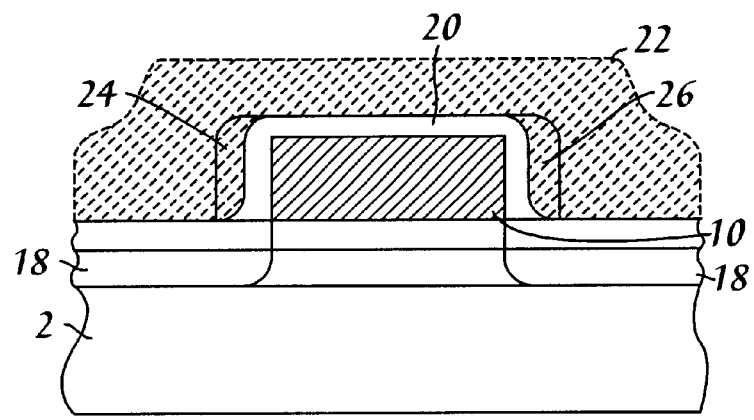
FIG. 5 is a cross-sectional view of a semiconductor topography illustrating the deposition and partial removal of a spacer material across the etch material.
Figure 6:
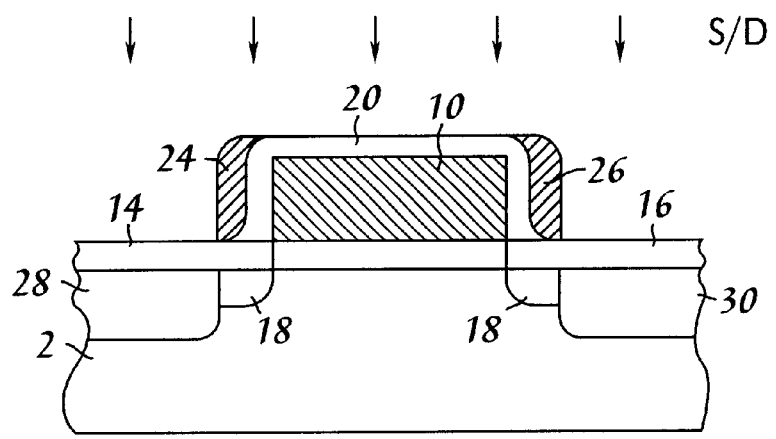
FIG. 6 is a cross-sectional view of a semiconductor topography illustrating a heavily doped source/drain implant that is forwarded to the exposed areas of the exposed regions and to the gate conductor.
Figure 7:
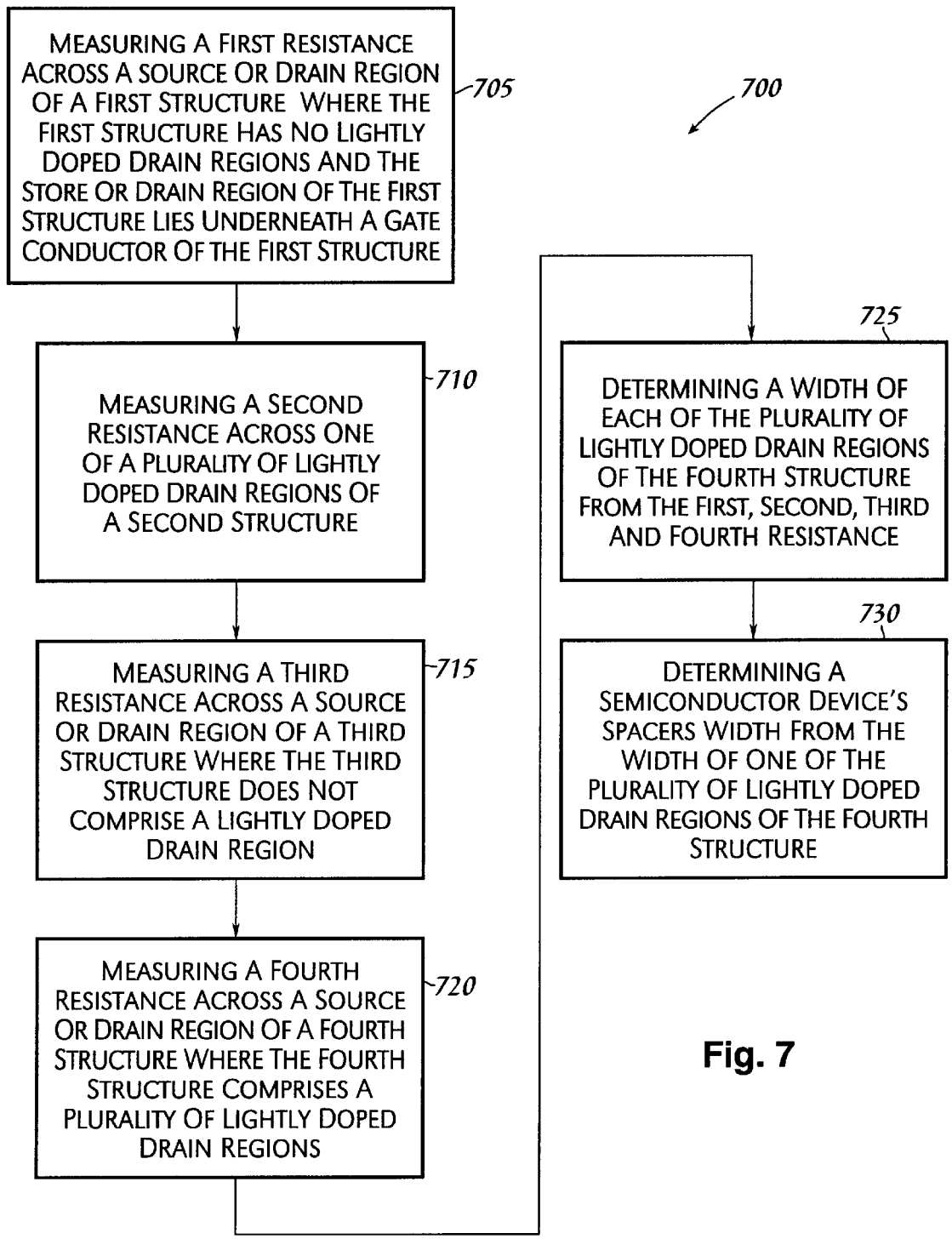
FIG. 7 is a flowchart of a method for electronically quantifying a semiconductor device's spacers' width.

FIG. 7—Method for Electrically Quantifying a Semiconductor Device's Spacers' Width FIG. 7 illustrates a method 700, according to an embodiment of the present invention, for electrically quantifying a semiconductor device's spacers' width. FIG. 7 will be discussed in conjunction with FIGS. 8–11 where FIGS. 8–11 each depict an embodiment of a semiconductor structure that may be used in method 700 for electrically quantifying a semiconductor device's spacers' width.

As discussed in the Background section, spacers of a semiconductor device, e.g., transistor, effectively control the width of LDD regions by controlling how far the drain and source regions are spaced from the sidewall surfaces of the gate conductor. The width of LDD regions effectively determine the length of the gate conductor which essentially determines the speed of the transistor. Therefore, it is imperative to develop a technique to quantify the width of the semiconductor device's spacers and thereby adjust the manufacturing process to control the width of LDD regions and hence control the speed of the semiconductor device, e.g., transistor.

One such technique for electrically quantifying a semiconductor device's spacers' width is method 700. Method 700 determines the width of a semiconductor device's spacers' by determining the width of one of the plurality of lightly doped drain regions in that semiconductor device from the resistance across a region of interest in four structurally distinct semiconductor structures which includes the semiconductor device in question.

Figure 8:
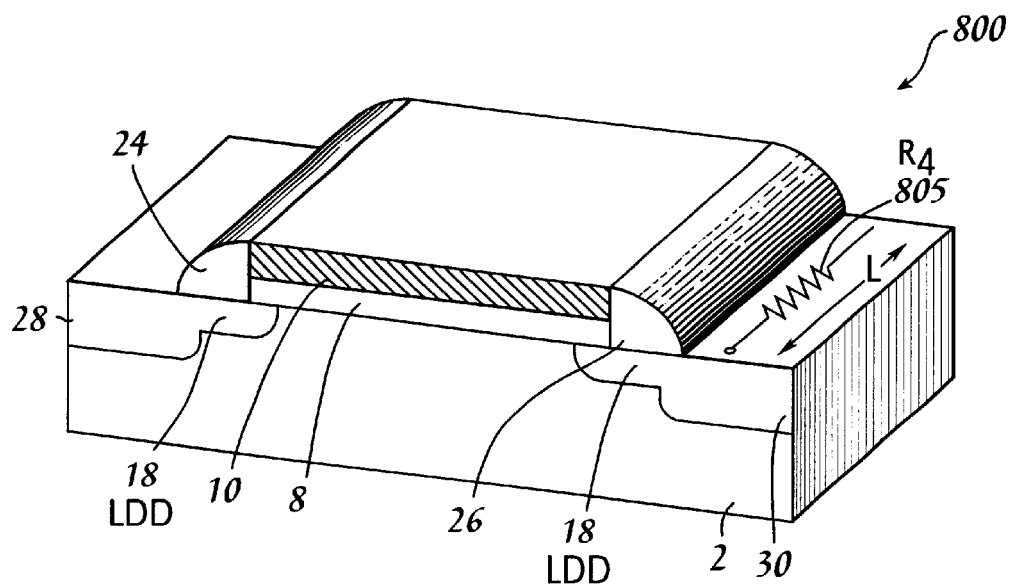
FIG. 8 illustrates an embodiment of a semiconductor structure where the width of each of the lightly doped drain regions is derived.

FIG. 8 illustrates a semiconductor structure 800 that comprises a substrate 2 with a gate oxide layer 8 etched onto substrate 2. Semiconductor structure 800 further comprises a gate conductor 10 etched onto gate oxide 8. A plurality of spacers, 24 and 26, whose widths are to be determined, are adjacent to sidewall surfaces 12 of gate conductor 10. Semiconductor structure 800 further comprises a plurality of lightly doped drain regions 18, whose widths are to be determined, with in the upper portion of substrate 2. Semiconductor structure 800 further comprises a drain region 28 of a heavily doped implant that extends between the inner and outer edge of one of the plurality of spacers, 24 and 26, to the outer edge of-substrate 2. Semiconductor structure 800 further comprises a source region 30 of a heavily doped implant that extends between the inner and outer edge of one of the plurality of spacers, 24 and 26, to the outer edge of substrate 2.

As stated above, in order to determine the width of a semiconductor device's spacers, e.g., 24 and 26 of semiconductor structure 800, the width of one of the plurality of lightly doped drain regions in that semiconductor device, i.e., semiconductor structure 800, must first be determined. A formula for determining the width of one of the plurality of lightly doped drain regions in a semiconductor structure, e.g., semiconductor structure 800, is the following:

$$W_{LDD}=[W_{S/D}*(((\rho_{S/D}*L)/(R4*W_{S/D}))-1)]*(\rho_{LDD}/\rho_{S/D}) \quad (EQ\ 1)$$

where $W_{LDD}$ is the width of each of the plurality of lightly doped drain regions in semiconductor structure 800; where $\rho_{LDD}$ is the resistivity of the plurality of lightly doped drain regions in semiconductor structure 800; where R4 is equal to the resistance of resistor R4 805; where $\rho_{S/D}$ is the resistivity of the source or drain region in semiconductor structure 800; where $W_{S/D}$ is the width of the source or drain region in semiconductor structure 800; and where L is the lateral thickness of each of the plurality of lightly doped drain regions and the source or drain region in semiconductor structure 800. It is noted that the width of a semiconductor device's spacers' and the width of each of the plurality of lightly doped drain regions of the semiconductor device may be determined in other embodiments implementing other formulas. It is further noted that the widths of spacers' and the widths of each of the plurality of lightly doped drain regions may be determined in other structural embodiments than semiconductor structure 800 and that semiconductor structure 800 is used for illustrative purposes only.

The above mentioned formula, (EQ1), may be derived as follows. The resistance of R4 805 is equal to the following:

$$R4=R_{LDD}//R_{S/D} \quad (EQ2),$$

where $R_{LDD}$ is equal to the resistance of one of the plurality of lightly doped drain regions of semiconductor structure 800; and where $R_{S/D}$ is equal to the resistance of either the source or drain region, 30 or 28, of semiconductor structure 800.

(EQ2) may further be rewritten in another form.

$$R4=(R_{LDD}*R_{S/D})/(R_{LDD}+R_{S/D}) \quad (EQ3)$$

Since the resistance of an element is equal to the resistivity, $\rho$, of the element * (length of the element (L))/(width of the element (W)), (EQ3) may be reduced to the following:

$$R4=((\rho_{LDD}*(L_{LDD}/W_{LDD}))*(\rho_{S/D}*(L_{S/D}/W_{S/D}))/(\rho_{LDD}*(L_{LDD}/W_{LDD}))+(\rho_{S/D}*(L_{S/D}/W_{S/D})) \quad (EQ4)$$

where $L_{LDD}$ is the lateral thickness of each of the plurality of lightly doped drain regions in semiconductor structure 800; and $L_{S/D}$ is the lateral thickness of the source or drain region in semiconductor structure 800.

Since $L_{LDD}$ is equal to $L_{S/D}$ in semiconductor structure 800 by device geometry, (EQ4) reduces to the following:

$$R4=((\rho_{LDD}*\rho_{S/D}*L)/(W_{LDD}*W_{S/D}))/((\rho_{LDD}/W_{LDD})+(\rho_{S/D}/W_{S/D})) \quad (EQ5)$$

By algebraically arranging the terms of (EQ5), (EQ1) is derived. Referring to (EQ1), terms $\rho_{S/D}$, $\rho_{LDD}$, and $W_{S/D}$ of (EQ1) must be derived before the width of one of the plurality of lightly doped drain regions in the semiconductor device, e.g., semiconductor structure 800, is determined.

Figure 9:
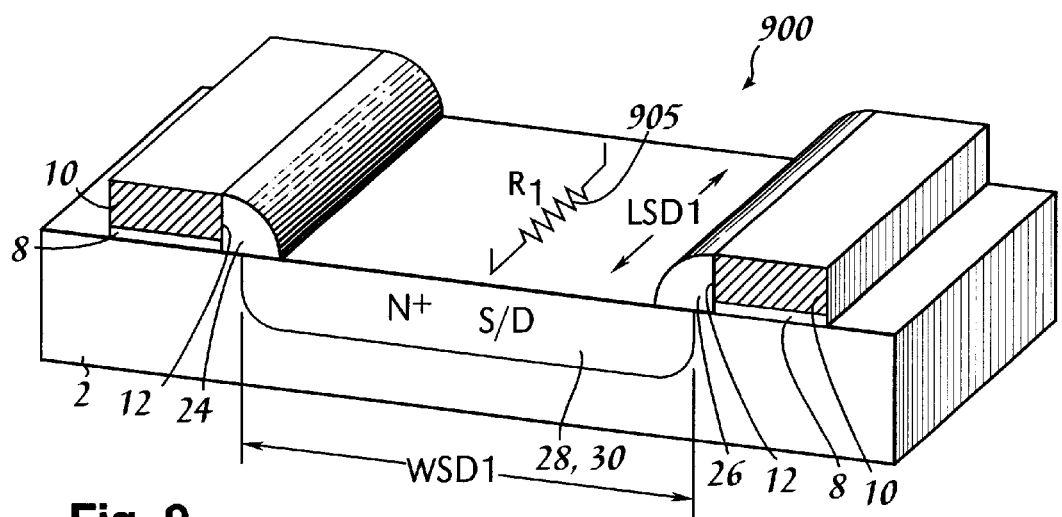
FIG. 9 illustrates an embodiment of a semiconductor structure where the resistivity of the source/drain region is derived.

Referring to method 700 of FIG. 7, in step 705, a first resistance is measured across a source or drain region of a semiconductor structure as depicted in FIG. 9. FIG. 9 illustrates a semiconductor structure 900 that comprises a substrate 2 with a gate oxide layer 8 etched onto substrate 2. Semiconductor structure 900 further comprises a gate conductor 10 etched onto gate oxide 8. A plurality of spacers, 24 and 26, are adjacent to sidewall surfaces 12 of gate conductor 10. Semiconductor structure 900 further comprises a source or drain region 28, 30 that lie within the upper portion of substrate 2 extending between the inner and outer edge of one of the spacers, e.g., 24, to between the inner and outer edge of the other spacer, e.g., 26.

The term $\rho_{S/D}$ of EQ(1) may be derived using semiconductor structure 900 from the following equation:

$$\rho_{S/D}=R1*((W_{S/D1})/(L_{S/D1})) \quad (EQ6)$$

where R1 is equal to the measured resistance across resistor R1 905; where $W_{S/D1}$ is equal to the width of the source or drain region 28, 30 of semiconductor structure 900; where $L_{S/D}$ is equal to the length of the source or drain region 28, 30 of semiconductor structure 900. It is noted that other embodiments of semiconductor structure 900 are possible to derive the resistivity of the source/drain region, $\rho_{S/D}$. It is further noted that the resistivity of the source/drain region, $\rho_{S/D}$ of semiconductor structure 900 is the same for other source/drain regions heavily implanted with the same type of dopant. It is further noted that the source and drain regions of semiconductor structures 800 and 1100 (FIG. 11) are assumed to be heavily implanted with the same type of dopant as semiconductor structure 900.

Figure 10:
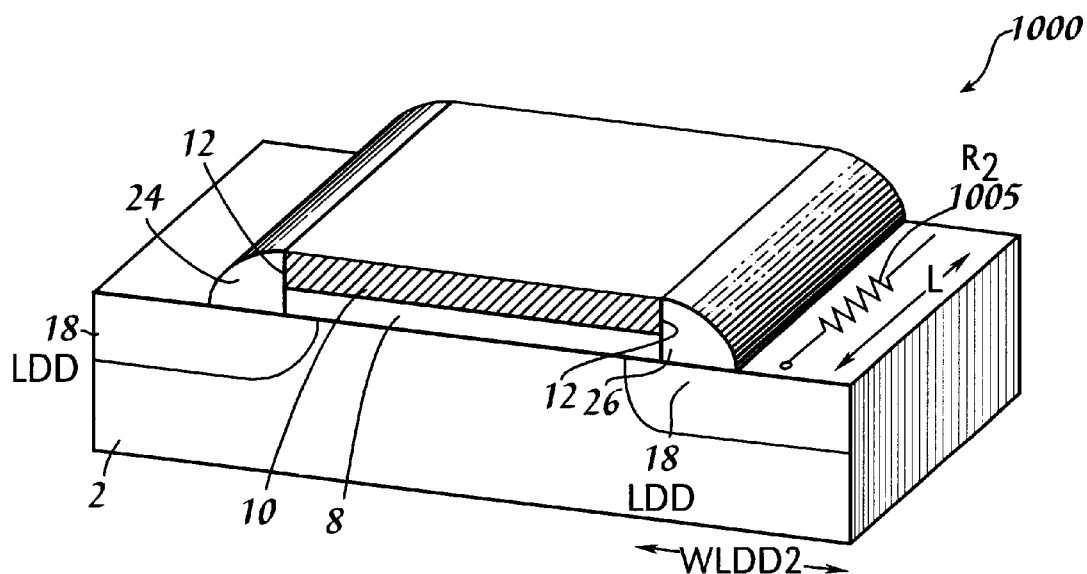
FIG. 10 illustrates an embodiment of a semiconductor structure where the resistivity of the lightly doped drain regions are derived.

In step 710, a second resistance is measured across one of a plurality of lightly doped drain regions of a semiconductor structure as depicted in FIG. 10. FIG. 10 illustrates a semiconductor structure 1000 that comprises a substrate 2 with a gate oxide layer 8 etched onto substrate 2. Semiconductor structure 1000 further comprises a gate conductor 10 etched onto gate oxide 8. A plurality of spacers, 24 and 26, are adjacent to sidewall surfaces 12 of gate conductor 10. Semiconductor structure 1000 further comprises a plurality of lightly doped drain regions 18 within the upper portion of substrate 2. The plurality of lightly doped drain regions 18 lie underneath spacers 24 and 26 extending from underneath gate conductor 10 to the outer edges of substrate 2.

The term $\rho_{LDD}$ of EQ(1) maybe derived using semiconductor structure 1000 from the following equation:

$$\rho_{LDD}=R2*((W_{LDD2})/(L_{LDD2})) \quad (EQ7)$$

where R2 is equal to the measured resistance across resistor R2 1005; where $W_{LDD2}$ is equal to the width of each of the plurality of lightly doped drain regions 18 of semiconductor structure 1100; where $L_{LDD2}$ is equal to the length of each of the plurality of lightly doped drain regions 18 of semiconductor structure 1100. It is noted that other embodiments of semiconductor structure 1000 are possible to derive the resistivity of the lightly doped drain region, $\rho_{LDD}$. It is further noted that the resistivity of the lightly doped drain region, $\rho_{LDD}$, of semiconductor structure 1000 is the same for other lightly doped drain regions implanted with the same type of impurity. It is further noted that the lightly doped drain regions of semiconductor structure 800 is assumed to be implanted with the same type of impurity as semiconductor structure 1000.

Figure 11:
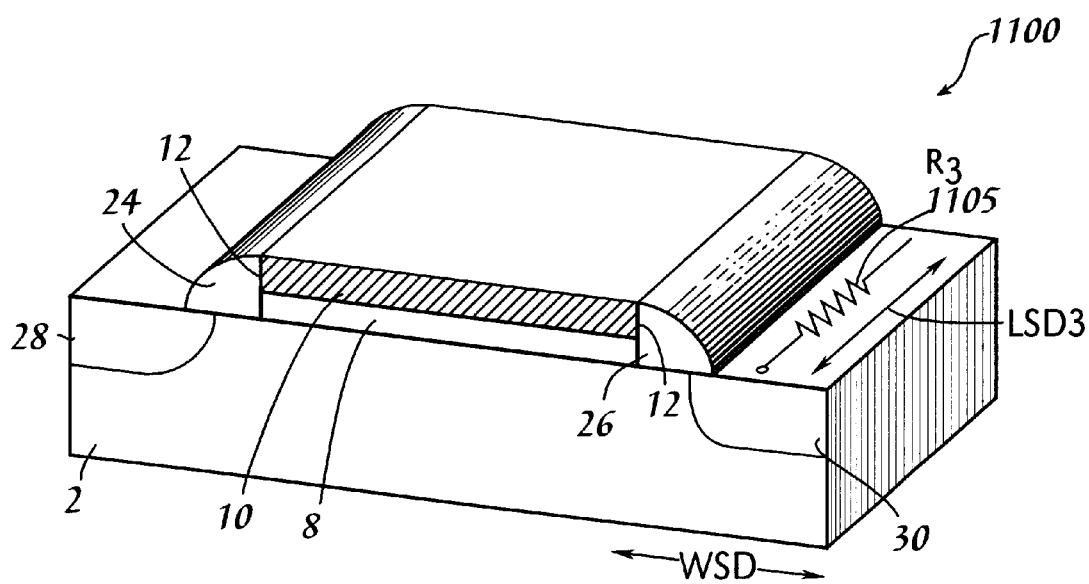
FIG. 11 illustrates an embodiment of a semiconductor structure where the width of the source/drain region is derived.

In step 715, a third resistance is measured across a source or drain region of a semiconductor structure as depicted in FIG. 11. FIG. 11 illustrates a semiconductor structure 1100 that comprises a substrate 2 with a gate oxide layer 8 etched onto substrate 2. Semiconductor structure 1100 further comprises a gate conductor 10 etched onto gate oxide 8. A plurality of spacers, 24 and 26, are adjacent to sidewall surfaces 12 of gate conductor 10. Semiconductor structure 1100 further comprises a drain region 28 of a heavily doped implant that extends between the inner and outer edge of spacer 24 to the outer edge of substrate 2. Semiconductor structure 1100 further comprises a source region 30 of a heavily doped implant that extends between the inner and outer edge of spacer 26 to the outer edge of substrate 2. It is noted that drain region 28 of semiconductor structure 1100 is symmetrical with source region 30 of semiconductor structure 1100 and therefore are the same width. It is further noted that the width of drain region 28 and source region 30 in semiconductor structure 1100 are equivalent to the width of drain region 28 and source region 30 in semiconductor structure 800.

The term $W_{SD}$ of EQ(1) may be derived using semiconductor structure 1100 from the following equation:

$$W_{SD}=(\rho_{S/D} * L_{S/D3})/R3 \qquad (EQ8)$$

where R3 is equal to the measured resistance across resistor R3 1105; where $L_{S/D3}$ is equal to the lateral thickness of the source or drain region of semiconductor structure 1100. It is noted that other embodiments of semiconductor structure 1100 are possible to derive the width of the source or drain region, $W_{SD}$.

In step 720, a fourth resistance is measured across the source or drain region, 30 or 28, of semiconductor structure 800. In step 725, the width of each of the plurality of lightly doped drain regions 18 of semiconductor structure 800 may then be solved using the following equation:

$$W_{LDD}=[W_{S/D} * (((\rho S/D * L)/(R4 * W_{S/D}))-1)] * (\rho LDD/\rho S/D) \qquad (EQ1),$$

where $\rho_{LDD}$ was determined implementing (EQ7); where R4 is the measured resistance across resistor R4 805; where $\rho_{S/D}$ was determined implementing (EQ6); where $W_{S/D}$ was determined implementing (EQ8); and where L is the lateral thickness of lightly doped drain regions 18 of semiconductor structure 800. It is noted that the plurality of lightly doped drain regions 18 are symmetrical and therefore each of the plurality of lightly doped drain regions 18 has the same width. It is further noted that spacers 24 and 26 are symmetrical with respect to one another and therefore spacers 24 and 26 have the same width.

Once the width of one of the plurality of lightly doped drain regions 18 is determined, the width of spacers 24 and 26 of semiconductor structure 800 is determined in step 730. Since the width of spacers 24 and 26 are correlated with the width of lightly doped drain regions 18, the width of spacers 24 and 26 maybe determined from the width of one of the plurality of lightly doped drain regions 18. Once the width of spacers 24 and 26 is determined, the manufacturing process, e.g., antisotrophic etching process, may then be adjusted to etch, i.e., remove, a proper amount of spacer material thereby leaving spacers with a desirable width. By quantifying the width of the spacers of a semiconductor device, e.g., transistor, the width of the lightly doped drain regions of the semiconductor device are effectively controlled and hence the speed of the semiconductor device, e.g., transistor, is effectively controlled.

Figure 12:
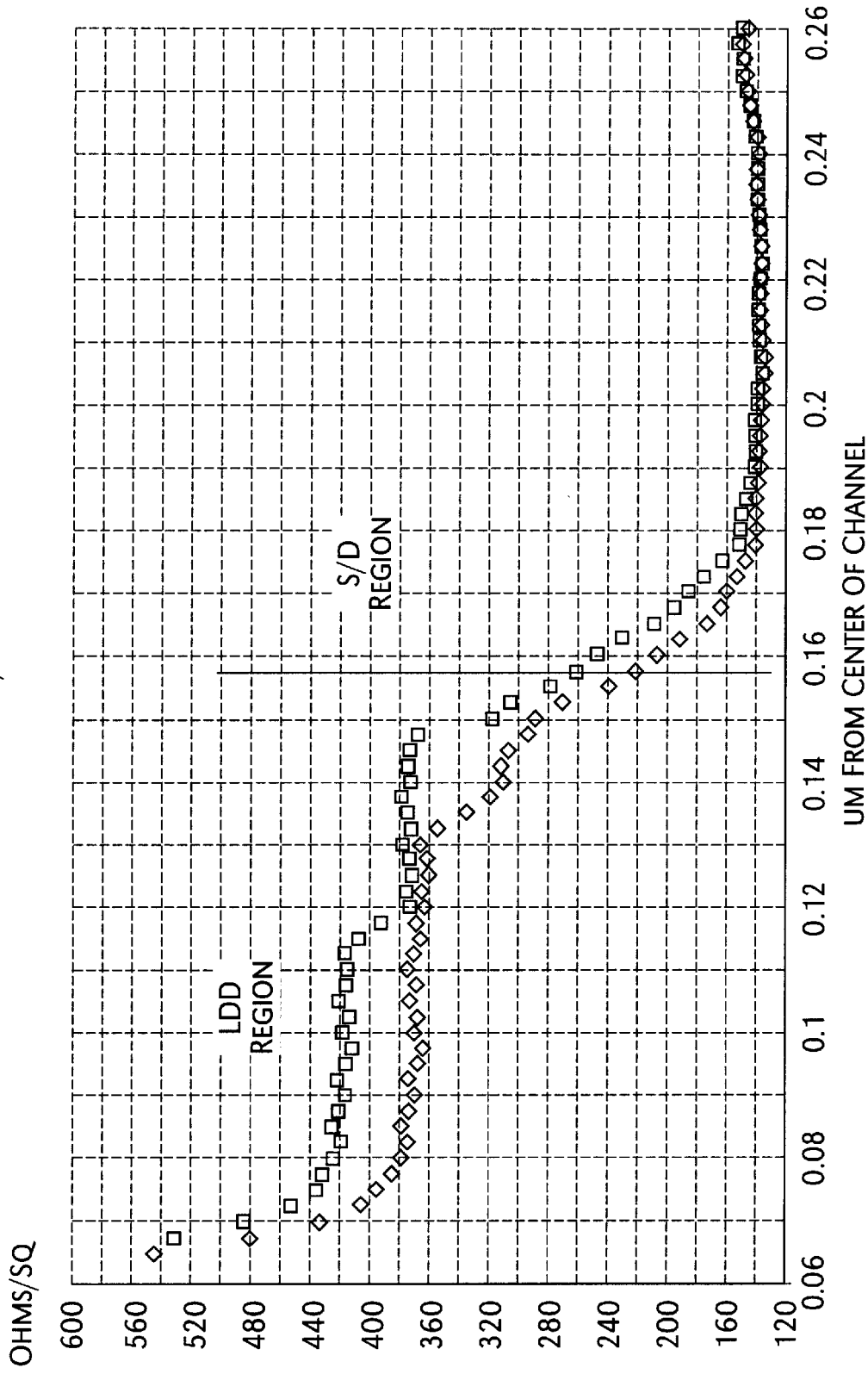
FIG. 12 is a chart illustrating the correlation between the width of a semiconductor device's spacer and the width and resistivity of the lightly doped drain regions.

FIG. 12—Chart Illustrating Relationship Between Spacer Width and LDD Width and Resistivity FIG. 12 illustrates a relationship between the width of a semiconductor device's spacer and the width and resistivity of the lightly doped drain regions of the semiconductor device. As illustrated in FIG. 12, there exists a correlation between the various widths of a semiconductor device's spacer and the various widths and changes in resistivity of the lightly doped drain regions of the semiconductor device.

Although the method, system and computer program product of the present invention is described in connection with several embodiments, it is not intended to be limited to the specific forms set forth herein, but on the contrary, it is intended to cover such alternatives, modifications, and equivalents, as can be reasonably included within the spirit and scope of the invention as defined by the appended claims. It is noted that the headings are used only for organizational purposes and not meant to limit the scope of the description or claims.

What is claimed is:

1. A method for electrically quantifying a semiconductor device's spacers' width comprising the steps of:

measuring a resistance across a region of interest of each of a plurality of semiconductor structures, wherein said plurality of semiconductor structures comprises said semiconductor device;

determining a width of one of a plurality of lightly doped drain regions of said semiconductor device from said resistance across said region of interest of each of said plurality of semiconductor structures; and determining said semiconductor device's spacers' width from said width of one of said plurality of lightly doped drain regions of said semiconductor device.

2. The method as recited in claim 1 further comprising the step of:

adjusting a manufacturing process based on said semiconductor device's spacers' width.

3. The method as recited in claim 2, wherein said adjusting said manufacturing process comprises:

adjusting an etch process in removing a spacer material to form said semiconductor device's spacers.

4. The method as recited in claim 3, wherein said etch process is an antisotrophic etch process.

5. The method as recited in claim 1, wherein said region of interest of a plurality of said plurality of semiconductor structures is a source or drain region of each of said plurality of said plurality of semiconductor structures.

6. The method as recited in claim 1, wherein said region of interest of one of said plurality of semiconductor structures is one of a plurality of lightly doped drain regions of one of said plurality of semiconductor structures.

7. The method as recited in claim 1, wherein each of said plurality of semiconductor structures are structurally distinct.

8. A method for electrically quantifying a semiconductor device's spacers' width comprising the steps of:

measuring a first resistance across a source or drain region of a first semiconductor structure;

measuring a second resistance across one of a plurality of lightly doped drain regions of a second semiconductor structure;

measuring a third resistance across a source or drain region of a third semiconductor structure;

measuring a fourth resistance across a source or drain region of a fourth semiconductor structure, wherein said fourth semiconductor structure comprises a plurality of lightly doped drain regions, wherein said fourth semiconductor structure is said semiconductor device;

determining a width of one of said plurality of lightly doped drain regions of said fourth semiconductor structure from said first, second, third and fourth resistance; and determining said semiconductor device's spacers' width from said width of one of said plurality of lightly doped drain regions of said fourth semiconductor structure.

9. The method as recited in claim 8, wherein said width of one of said plurality of lightly doped drain regions of said fourth semiconductor structure is equal to the equation:

$$W_{LDD}=[W_{S/D}*(((\rho_{S/D}*L)/(R4*W_{S/D}))-1)]*(\rho_{LDD}/\rho_{S/D})$$

wherein $W_{LDD}$ is the width of each of said plurality of lightly doped drain regions in said fourth semiconductor structure;

wherein $W_{S/D}$ is the width of said source or drain region in said third and fourth semiconductor structures;

wherein $\rho_{S/D}$ is the resistivity of said source or drain region of said first, third and fourth semiconductor structures;

wherein L is the lateral thickness of said plurality of lightly doped drain regions and said source or drain region in said fourth semiconductor structure;

wherein R4 is equal to said fourth resistance; and wherein $\rho_{LDD}$ is the resistivity of said plurality of lightly doped drain regions of said second and fourth semiconductor structure.

10. The method as recited in claim 9, wherein said ρsd is equal to the equation:

$$\rho S/D = \text{said first resistance} * (W_{S/D1}/L_{S/D1})$$

wherein $W_{S/D1}$ is equal to the width of said source or drain region of said first semiconductor structure; and wherein $L_{S/D1}$ is equal to the lateral thickness of said source or drain region of said first semiconductor structure.

11. The method as recited in claim 10, wherein said ρldd is equal to the equation:

$$\rho_{LDD} = \text{said second resistance} * (W_{LDD2}/L_{LDD2})$$

wherein $W_{LDD2}$ is equal to the width of each of said plurality of lightly doped drain regions of said second semiconductor structure; and wherein $L_{LDD2}$ is equal to the lateral thickness of each of said plurality of lightly doped drain regions of said second semiconductor structure.

12. The method as recited in claim 11, wherein said wsd is equal to the equation:

$$W_{S/D}=(\rho_{S/D}*L_{S/D3})/(\text{said third resistance})$$

wherein $L_{LD/S3}$ is equal to the lateral thickness of said source or drain region of said third semiconductor structure.

13. The method as recited in claim 8 further comprising the step of:
adjusting a manufacturing process based on said semiconductor device's spacers' width.

14. The method as recited in claim 13, wherein said adjusting said manufacturing process comprises:
adjusting an etch process in removing a spacer material to form said semiconductor device's spacers.

15. The method as recited in claim 14, wherein said etch process is an antisotrophic etch process.

16. The method as recited in claim 8, wherein said first semiconductor structure comprises:
a substrate;
a gate oxide layer etched onto said substrate;
a gate conductor etched onto said gate oxide;
a plurality of spacers adjacent to sidewalls of said gate conductor; and
said source or drain region of a heavily doped implant that lies underneath said gate conductor from between the inner and outer edge of one of said spacers to between the inner and outer edge of the other of said spacers.

17. The method as recited in claim 8, wherein said second semiconductor structure comprises:
a substrate;
a gate oxide layer etched onto said substrate;
a gate conductor etched onto said gate oxide;
a plurality of spacers adjacent to sidewalls of said gate conductor; and
said plurality of lightly doped drain regions within the upper portion of said substrate, wherein said plurality of lightly doped drain regions lie underneath each of said plurality of spacers extending from underneath said gate conductor to the outer edges of said substrate.

18. The method as recited in claim 8, wherein said third semiconductor structure comprises:
a substrate;
a gate oxide layer etched onto said substrate;
a gate conductor etched onto said gate oxide;
a plurality of spacers adjacent to sidewalls of said gate conductor;
said drain region of a heavily doped implant that extends between the inner and outer edge of one of said plurality of spacers to the outer edge of said substrate; and
said source region of a heavily doped implant that extends between the inner and outer edge of one of said plurality of spacers to the outer edge of said substrate.

19. The method as recited in claim 8, wherein said fourth semiconductor structure comprises:
a substrate;
a gate oxide layer etched onto said substrate;
a gate conductor etched onto said gate oxide;
a plurality of spacers adjacent to sidewalls of said gate conductor;
said plurality of lightly doped drain regions within the upper portion of said substrate;
said drain region of a heavily doped implant that extends between the inner and outer edge of one of said plurality of spacers to the outer edge of said substrate; and
said source region of a heavily doped implant that extends between the inner and outer edge of one of said plurality of spacers to the outer edge of said substrate.

* * * * *

UNITED STATES PATENT AND TRADEMARK OFFICE
CERTIFICATE OF CORRECTION

PATENT NO. : 6,287,877 B1
DATED : September 11, 2001
INVENTOR(S) : Roger Williams; Mark Brandon Fuselier; Michael Verne Fenske It is certified that error appears in the above-identified patent and that said Letters Patent is hereby corrected as shown below:

Drawings,
Sheet 3 of 6, Figure 7, Box 705, after "the", replace "store" with -- source --.

Column 1,
Line 26, after "i.e.," insert a space.

Column 4,
Line 55, "with in" should be -- within --.

Column 7,
Line 55, "antisotrophic" should be -- antistrophic --

Column 8,
Line 37, "antisotrophic" should be -- antistrophic --.

Column 10,
Line 2, "antisotrophic" should be -- antistrophic --.

Signed and Sealed this

Fifth Day of March, 2002

Attest:

Attesting Officer

JAMES E. ROGAN
Director of the United States Patent and Trademark Office